(12) United States Patent
Liou

(10) Patent No.: US 6,251,788 B1
(45) Date of Patent: Jun. 26, 2001

(54) METHOD OF INTEGRATED CIRCUIT POLISHING WITHOUT DISHING EFFECTS

(75) Inventor: Ping Liou, Hsinchu (TW)

(73) Assignee: Winbond Electronics Corp., Hsinch (TW)

(*) Notice: Subject to any disclaimer, the term of this patent is extended or adjusted under 35 U.S.C. 154(b) by 0 days.

(21) Appl. No.: 09/304,473

(22) Filed: May 3, 1999

(51) Int. Cl.$^7$ .................................................. H01L 21/304
(52) U.S. Cl. .................... 438/693; 438/690; 438/691; 438/692; 438/694
(58) Field of Search ........................ 438/690–694

(56) References Cited

U.S. PATENT DOCUMENTS

| | | | |
|---|---|---|---|
| 5,422,223 | * 6/1995 | Sachdev et al. | 430/190 |
| 5,494,858 | * 2/1996 | Gnade et al. | 437/231 |
| 5,635,408 | * 6/1997 | Sano et al. | 437/4 |
| 5,736,424 | * 4/1998 | Prybyla et al. | 437/228 |
| 5,821,138 | * 10/1998 | Yamazaki et al. | 438/166 |
| 5,824,236 | * 10/1998 | Hawkins et al. | 216/26 |
| 5,877,080 | * 3/1999 | Aoi et al. | 438/622 |
| 6,150,274 | * 11/2000 | Liou et al. | 438/692 |
| 6,152,148 | * 11/2000 | George et al. | 134/2 |
| 6,153,525 | * 11/2000 | Hendricks et al. | 438/692 |

OTHER PUBLICATIONS

Wolf, Stanley, "Silicon Processing for the VLSI Era", vol. 2. pp. 229–232, 1990.*

* cited by examiner

Primary Examiner—Benjamin L. Utech
Assistant Examiner—Charlotte A. Brown
(74) Attorney, Agent, or Firm—W. Wayne Liauh

(57) ABSTRACT

A method for planarizing the surface of a semiconductor wafer is disclosed. It involves the steps of: (a) applying a coating solution containing a polymeric material on the dielectric film; (b) curing the polymeric material to cause the polymeric material to become hardened and form a polymeric layer; (c) subjecting the polymeric layer to a gas plasma treatment, so that at least a portion of the polymeric layer becomes a SiO$_2$-like layer which can be polished by a conventional oxide-type CMP slurry; (d) depositing a PETEOS film on the SiO$_2$-like layer; and (f) CMP polishing the PETEOS film and the SiO$_2$-like laye using a conventional oxide-type CMP slurry. This method is particularly advantageous for fabricating semiconductor devices with relatively wide trenches wherein the polymer layer would warp into the bottom of the trench thus will not serve as an effective self-provided etch stop.

9 Claims, 4 Drawing Sheets

METHOD OF INTEGRATED CIRCUIT POLISHING WITHOUT DISHING EFFECTS

FIELD OF THE INVENTION

The present invention relates to an improved method for the planarization of very large multilayered integrated circuits (VLSI) or ultra-large integrated circuits (ULSI) using a chemical-mechanical polishing (CMP) process. More specifically, the present invention relates to an improved method for performing chemical-mechanical polishing operations which eliminates or at least substantially minimizes the dishing effects often experienced when one attempts to utilize $SiO_2$-based spin-on-glass (SOG) as the sacrificing material to provide a planarized interconnection layer. The method disclosed in the present invention is most advantageous for fabricating semiconductor devices having relatively wide trenches such that the dishing effect is more profound.

BACKGROUND OF THE INVENTION

In the fabrication of ultra-large scale-integration (ULSI) circuits it has been very common to utilize vertical stacking, or vertical integration, of metal wiring circuits to form multilevel interconnection. Multilevel fabrication process has become an efficient way to increase circuit performance and increase the functional complexity of the circuits. One drawback of multilevel interconnection is the loss of topological planarity resulting from various photolithographic and etching processes. The various integrated circuit fabrication processes invariably produce nonplanar surface, or nonplanar topography, on the wafer, from which semiconductor devices are fabricated. During the multilevel metallization of VLSI or ULSI devices, the multiplicity of layers of nonplanar surfaces further add together to cause even more serious topography problems. For example, the conductive or insulative properties of the various deposited films can be degraded on the area of the film layers across the step height. Those films in high topography areas can be easily broken during heat, electrical current, or mechanical stress steps, resulting in the pattern areas becoming discontinuous. Such discontinuity can cause failures in the device to perform certain intended functions. Furthermore, a nonplanar surface cannot be precisely focused during the photolithography process, because the depth of focus of the conventional photolithographic stepper will be deviated by different step heights of the wafer. Such an out-of-focus problem is more profound with respect to device features of very small sizes.

To alleviate these problems, the wafer is planarized at various stages in the fabrication process to minimize nonplanar topography and thus its adverse effects. Such planarization is typically implemented in the dielectric layers. However, it is also possible to implement the planarization process in the conductor layer. More recently, chemical-mechanical polishing (CMP) processes have become very well received to planarize the wafer surface in preparation for further device fabrication. The CMP process mainly involves the step of holding a semiconductor wafer against a rotating polishing pad surface wetted by a polishing slurry, which typically comprises an acidic or basic etching solution in combination with alumina or silica particles. On the one hand, the liquid portion of the slurry chemically removes, loosens, or modifies the composition of the material on the wafer which is to be removed. On the other hand, the particle portion of the slurry, in combination of the rotating polishing pad, physically removes the chemical modified material from the wafer. Thus, the name "chemical-mechanical polishing" was obtained.

One of the most commonly used sacrificial materials in the chemical-mechanical polishing process is a solution-type silicon dioxide, which is commonly referred to as the spin-on-glass (SOG). The $SiO_2$-based SOG is initially formed as a low viscosity solution which can be coated onto the nonplanar surface to quickly fill the recessed areas by a conventional spin coating technique. After the SOG coating, the coated layer is hard-baked to remove the solvent contained therein and turn the SOG layer into a hardened layer. Because of its high electrical resistance, the solidified SOG layer on top of the integrated circuit structure (i.e., the metal layer) must be etched back, typically by a chemical-mechanical polishing procedure using an abrasive slurry containing hydrogen fluoride in the chemical portion of the polishing procedure. If the SOG layer on the top surface of the wafer is not completely removed, it can generate the so-called vias poisoning, causing the vias to have a very high electrical resistance and adversely affect the interlayer conduction.

One of the commonly observed problems in using SOG during the planarization process is the so-called dishing effect. The etching process is not a selective process and it will remove all the affected material on the wafer surface. During the chemical-mechanical polishing of the SOG layer, the portion of the SOG layer inside the trenches can be affected by the etching solution being dished out from the mechanical polisher, resulting another type of un-planarized top surface. Many times, the dishing effect could cause even more serious nonplanar surface on the wafer. One way to ameliorate the dishing effect in the etch back process is to use a etch-back photoresist. However, this would require an extra photolithography process using an extra photo mask to remove the sacrificial material above the patterned structure. This can add substantially to the total manufacturing cost.

Another way to avoid such dishing effect is to use a non-silicon-based polymeric material, such as polyimide, which exhibits excellent chemical and electrical resistance, as the sacrificial material for chemical-mechanical polishing processes. The polymer-based sacrificial material, however, will not be removed by the conventional chemical-mechanical polishing slurry designed for SOG. Thus, the IC manufacturers must stock two different types of chemical-mechanical polishing slurries. And the use of a different chemical-mechanical polishing slurry may cause material compatibility problems and other handling concerns. In a co-pending application, it was demonstrated that excellent result can be obtained by treating the polymeric material so that it becomes removable by hydrofluoric acid. However, in semiconductor devices which contain relatively wide trenches, the polymeric sacrificial layer will be warped into the trench bottom, and the dishing effect can again become significant.

U.S. Pat. No. 4,944,836 disclosed a chemical-mechanical polishing method for producing coplanar metal-insulator films on a substrate. It taught the conventional approach of using silicon dioxide based slurry to provide a planarized surface by chemical-mechanical polishing. However, when the layer thickness of the semiconductor device becomes increasing thin, and the depth of the trench becomes correspondingly shallow, the dishing effect caused by the exposure of the silicon dioxide in the trench area becomes relatively more profound.

U.S. Pat. No. 5,169,491 disclosed a method for planarizing $SiO_2$-containing dielectric in semiconductor wafer processing. It involved the steps of (1) providing a layer of undoped $SiO_2$ atop a wafer; (b) depositing a layer of borophosphosilicate glass (BPSG) atop the layer of undoped $SiO_2$; and (c) chemical mechanical polishing the borophosphosilicate glass selectively relative to the underlying layer of undoped $SiO_2$ and using the underlying layer of undoped $SiO_2$ as an etching stop.

U.S. Pat. No. 5,314,843 disclosed a method for planarizing a semiconductor wafer using the chemical-mechanical polishing process. The method included the steps of (1) masking the semiconductor wafer surface layer to define first and second laterally adjacent portions; (2) altering only the first portion of the surface layer of material to polish at a different removal rate in the chemical-mechanical polishing process than the second portion of the surface layer; and (3) polishing the surface in the chemical-mechanical polishing process. As discussed before, the method disclosed in the '843 patent may minimize the dishing effect, but it requires an additional expensive photolithography step.

SUMMARY OF THE INVENTION

The primary object of the present invention is to develop an improved chemical-mechanical polishing method for the fabrication of multilayer semiconductor devices on a substrate. More specifically, the primary object of the present invention is to develop an alternate sacrificing composition which can eliminate or at least minimize the dishing effect but which can be polished by using conventional oxide-type CMP slurry used in the chemical-mechanical polishing of silicon dioxide based spin-on glass (SOG). The method disclosed in the present invention helps to extend the range of applicability of the method disclosed in a co-pending application and is most advantageous for fabricating semiconductor devices which have relatively wide trenches such that the dishing effect is more profound and may not be effectively controlled using the method disclosed in the co-pending application.

In the method disclosed in the present invention, a polymeric material, such as polyimide, is used as the sacrificial material for chemical-mechanical polishing operations. The polymeric material so selected should exhibit excellent electrical resistance, chemical resistance and mechanical properties after it is cured. The polymeric material should also exhibit relatively low viscosity after it is dissolved in a solvent, so that it can effectively fill the trenches in the surface layer of the wafer. After the polymeric material is coated on the wafer surface and cured, it will be subject to an $N_2O$ plasma treatment such that it can be removed by conventional SOG-type chemical-mechanical polishing slurries, which contain hydrofluoric acid. In other words, the polymeric material so selected to serve as the sacrificial material of the present invention will become $SiO_2$-like after the gas plasma treatment. If the trenches are not too wide, the polymeric material remaining in the trenches can be relatively unaffected and can also serve as a self-etch stop. However, in semiconductor devices which contain relatively wide trenches, the polymeric sacrificial layer will be warped into the trench bottom, and dishing effect can again become significant. This is a weak area not covered by the method disclosed in a co-pending application.

The present invention remedies this problem by forming a PETEOS (plasma enhanced tetraethyl orthosilicate) film on top of the $SiO_2$-like polymer layer. Finally the wafer is polished to chemically and mechanically remove the PETEOS film and the $SiO_2$-like layer. The PETEOS film has a chemical-mechanical polishing rate about half of that of $SiO_2$-like material, it can serve as a stop layer to minimize the dishing effect is the wide trench regions.

In summary, the method disclosed in the present invention comprises the following steps, which are part of the overall process in fabricating a semiconductor device;

(1) depositing an oxide layer on a semiconductor wafer having a non-planar surface;

(2) depositing a coating solution containing a polymeric material on the oxide layer;

(3) curing the polymeric material to cause the polymeric material to harden and form a polymeric layer;

(4) subjecting the hardened polymeric layer to an $N_2O$ plasma treatment, so that at least a portion of the polymeric layer becomes a $SiO_2$-like polymer layer;

(5) forming a PETEOS film on the $SiO_2$-like polymer layer; and (6) polishing the $SiO_2$-like polymer layer and the PETEOS film using a chemical-mechanical polishing (CMP) process utilizing a conventional CMP slurry which is effective is polishing an oxide layer.

The method disclosed in the present invention remedies a weak area not covered by the method disclosed in the co-pending invention. Both inventions not only allow oxide-type slurries to be used for the chemical-mechanical polishing of sacrificial layers made of non-oxide-type polymeric materials thus eliminating or minimizing the dishing effect, they also allow the presence of either a self or external etch stop to be provided to minimize the dishing effect. As a result, the method disclosed in the present invention substantially improves the degree of planarization for the chemical-mechanically polished wafer surface, without incurring a substantially increased manufacturing cost.

BRIEF DESCRIPTION OF THE DRAWING

The present invention will be described in detail with reference to the drawing showing the preferred embodiment of the present invention, wherein:

FIG. 1A shows that an oxide-based sacrificial layer was formed on a non-planar surface of a semiconductor wafer.

FIG. 1B shows that a different type of non-planar topography is left after the chemical-mechanical polishing process on the oxide-based sacrificial layer.

FIG. 2A shows that an oxide layer is formed on the wafer surface to protect the substrate from being contacted by the sacrificial layer material, the wafer surface contains a non-planar topography having two metal components separated by a wide trench.

FIG. 2B shows that a hardened polymeric material based sacrificial layer is formed on the non-planar surface of the semiconductor wafer.

FIG. 2C shows the polymer material based sacrificial layer is changed into a $SiO_2$-like layer after an $N_2O$ plasma treatment.

FIG. 2D shows that a PETEOS film was formed on top of the $SiO_2$-like sacrificial layer.

FIG. 2E shows the beginning of the chemical-mechanical polishing process to remove the PETEOS film and the $SiO_2$-like sacrificial layer.

DETAILED DESCRIPTION OF THE PREFERRED EMBODIMENT

The present invention discloses an improved chemical-mechanical polishing method for the fabrication of multilayer semiconductor devices on a substrate which expands the range of applicability of the method disclosed in the co-pending application. The present invention allows a chemically inert polymeric and non-$SiO_2$-based sacrificing composition to be used in the chemical-mechanical polishing processes but which can be developed by the same slurry used in the chemical-mechanical polishing of silicon dioxide based spin-on glass (SOG). Unlike the co-pending application wherein the polymeric layer can serve as a self-provided etch stop, the method disclosed in the present invention helps to extend the range of applicability to the fabrication of semiconductor devices containing wide trenches where such self-provided etch stop may not be available.

Figure 1A:
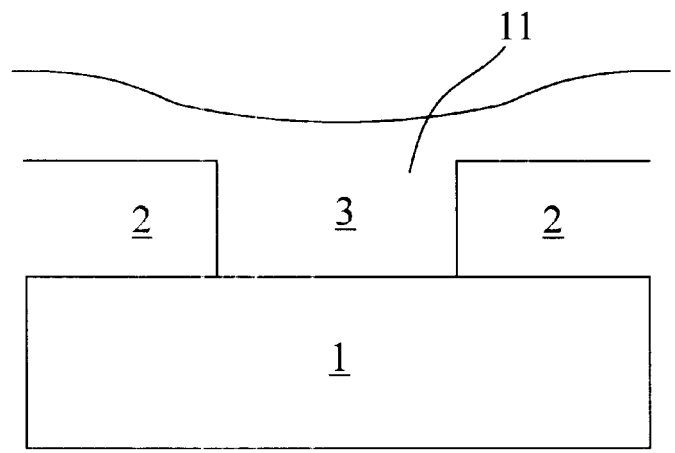
FIGS. 1A through 1B are illustrative schematic drawings showing the various steps of the conventional chemical-mechanical polishing process utilizing a $SiO_2$ based spin-on glass (SOG) as the sacrificial material.
Figure 1B:
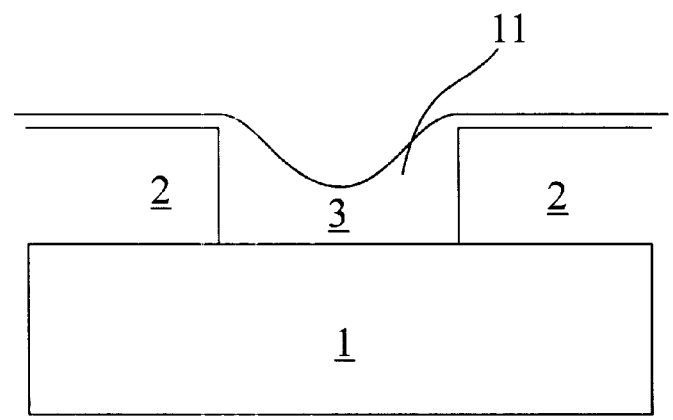

FIGS. 1A and 1B illustrate the problem caused by the dishing effect as experienced with the conventional chemical-mechanical polishing processes. FIG. 1A shows that an oxide-based sacrificial layer 11 was formed on a non-planar surface of a semiconductor wafer 1 to fill in a gap 3 between two active regions 2. FIG. 1B shows that a different type of non-planar topography is left after the chemical-mechanical polishing process on the oxide-based sacrificial layer. The new non-planar topography was formed due to the dishing effect, by which the SOG material in the trench region was etched away by the hydrofluoric acid contained in the chemical-mechanical polishing slurry. Under certain conditions, the final surface can be more non-planar than the original surface before polishing.

In the method disclosed in the present invention, a polymeric material, such as polyimide, is used as the sacrificial material for chemical-mechanical polishing operations. The polymeric material so selected should exhibit excellent electrical resistance, chemical resistance and mechanical properties after it is cured. The polymeric material should also exhibit relatively low viscosity after it is dissolved in a solvent, so that it can effectively fill the trenches in the surface layer of the wafer. After the polymeric material is coated on the wafer surface and cured, it will be subject to an $N_2O$ plasma treatment such that it can be removed by conventional oxide-type chemical-mechanical polishing slurries, such as potassium hydroxide-stabilized slurry with fused silica. In other words, the polymeric material so selected to serve as the sacrificial material of the present invention will become $SiO_2$-like after the gas plasma treatment. If the trenches are not too wide, the polymeric material remaining in the trenches can be relatively unaffected and can also serve as a self-etch stop. However, if the semiconductor devices contain relatively wide trenches, the polymeric sacrificial layer will be warped into the trench bottom, and dishing effect can again become significant. This is the weak area not covered by the method disclosed in a co-pending application.

As discussed above, the present invention remedies this problem by forming a PETEOS (plasma enhanced tetraethyl orthosilicate) film on top of the $SiO_2$-like polymer layer. Finally the wafer is polished to chemically and mechanically remove the PETEOS film and the $SiO_2$-like layer. The PETEOS film has a chemical-mechanical polishing rate about half of that of $SiO_2$-like material, it can thus serve as a stop layer to minimize the dishing effect is the wide trench regions.

The method disclosed in the present invention, which constitutes part of the overall process for the fabrication of semiconductor devices, can be summarized as comprising the following steps:

(1) Forming an oxide layer on a semiconductor wafer having a non-planar surface. The non-planar surface typically contains a plurality of metal components separated by at least a wide trench.

(2) Applying a coating solution containing a polymeric material on a semiconductor wafer having a non-planar surface. One of the requirements of the polymeric material for the present invention is that it can be converted into a $SiO_2$-like material and can be polished by conventional oxide-type CMP slurry after an $N_2O$ plasma treatment.

(3) Curing the polymeric material to cause the polymeric material to harden and form a hardened polymeric layer.

(4) Subjecting the hardened polymeric layer to an $N_2O$ plasma treatment, so that at least a portion of the polymeric layer becomes a $SiO_2$-like polymer layer which can be CMP-polished by an conventional oxide-type CMP slurry.

(5) Forming a PETEOS film on the $SiO_2$-like polymer layer. For a wafer surface with wide trenches, the $SiO_2$-like polymer layer typically will be warped onto the bottom of the trench surface (because of the desire to minimize the film thickness of the $SiO_2$-like layer), resulting in a relatively uniformed thickness for the polymer layer. During the $N_2O$ plasma treatment, essentially all the polymer layer will be converted into $SiO_2$-like layer, thus necessitating the need for an external etch stop layer. The chemical-mechanical removal rate of the PETEOS film is only about half of that of oxide-type SOG.

(6) Polishing the $SiO_2$-like polymer layer and the PETEOS film using a CMP process with a conventional oxide-type CMP slurry, such as potassium hydroxide-stabilized slurry with fused silica.

In a preferred embodiment of the present invention, the polymeric material is polyimide. Other polymers such as polyamide, polyamideimide, etc., can also be used in the present invention. The main criteria are that it exhibits low viscosity to allow for spin coating after dissolved into a solvent, and that it can be etched by hydrofluoric acid after being subject to an $N_2O$ plasma treatment. Other plasma gases, such as $N_2$, $O_2$, argon, etc. The plasma gas treatment can be conducted at a low pressure (in the order of several Torr), and low RF power (preferably in the range of 100 to 300 Watt).

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLES 1–6

Figure 2A:
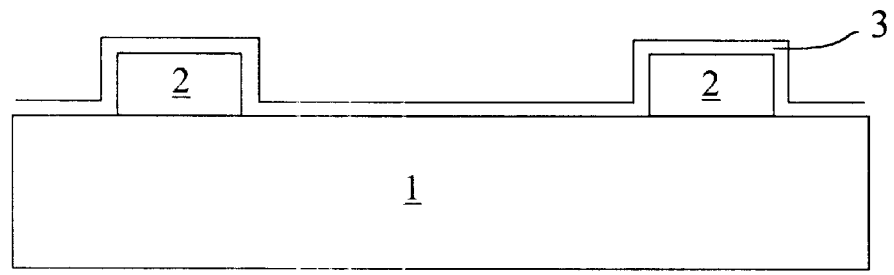
FIGS. 2A through 2E are illustrative schematic drawings showing the various steps of the improved chemical-mechanical polishing process according to a preferred embodiment of the present invention utilizing a polymer based sacrificial material.
Figure 2B:
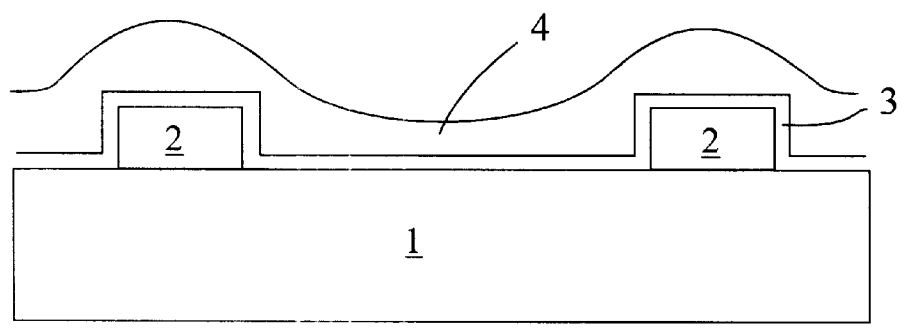

FIGS. 2A through 2F are illustrative schematic drawings showing the main steps of the improved chemical-mechanical polishing process according to a preferred embodiment of the present invention which utilizes a polymer based sacrificial material and is applied on a wafer surface with relatively wide trenches. The polymeric based sacrificial material was polyimide, which exhibited excellent electrical and chemical resistance and the required mechanical properties. In FIG. 2A, it was shown that a thin oxide layer 3 was formed on the wafer surface to protect the substrate from being contacted by the sacrificial layer material, the wafer surface contains a non-planar topography having two metal components 2 on a substrate 1 separated by a wide trench 11. FIG. 2B shows that a hardened polymeric material based sacrificial layer 4 is formed on the non-planar surface of the semiconductor wafer. The large width of the trench 11 caused the sacrificial layer 4 to warp to the bottom of the trench, and the polymeric sacrificial layer 4 had a relatively uniform thickness.

Figure 2C:
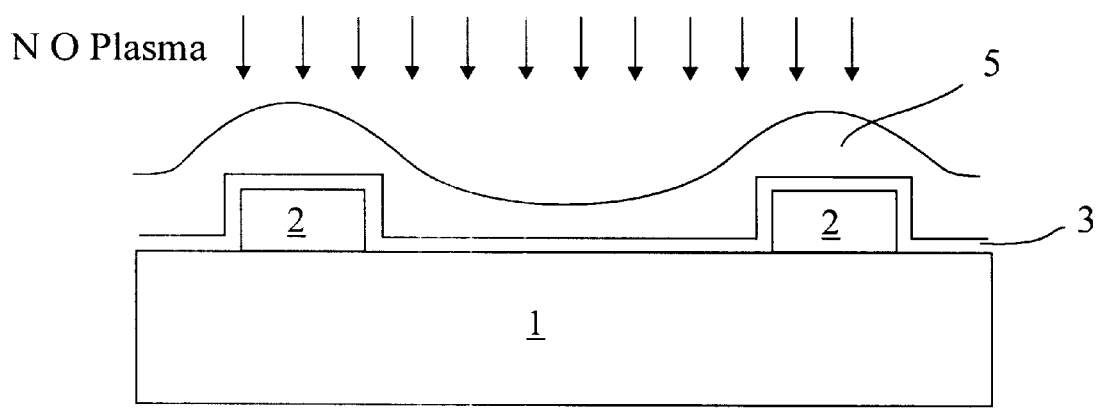
Figure 2D:
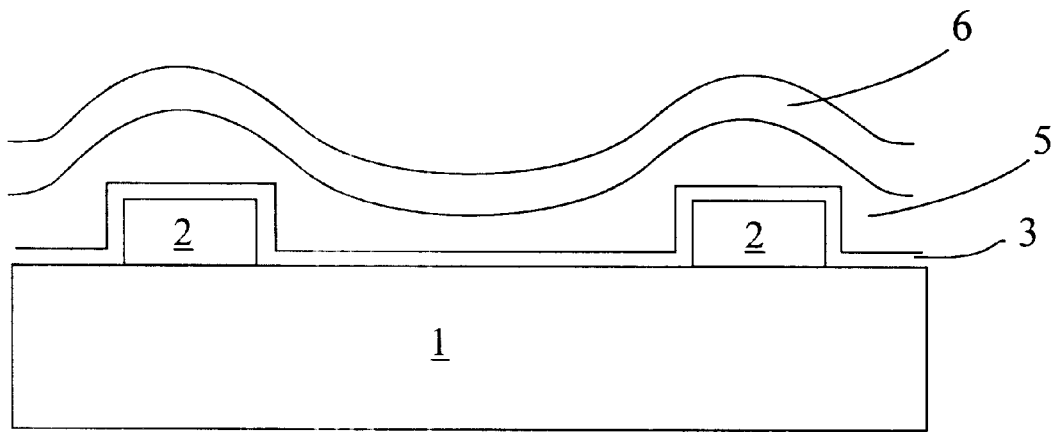
Figure 2E:
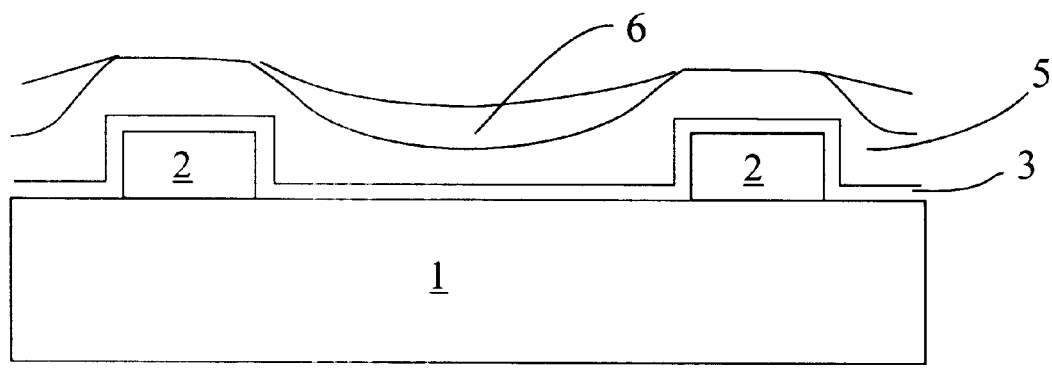
Figure 2F:
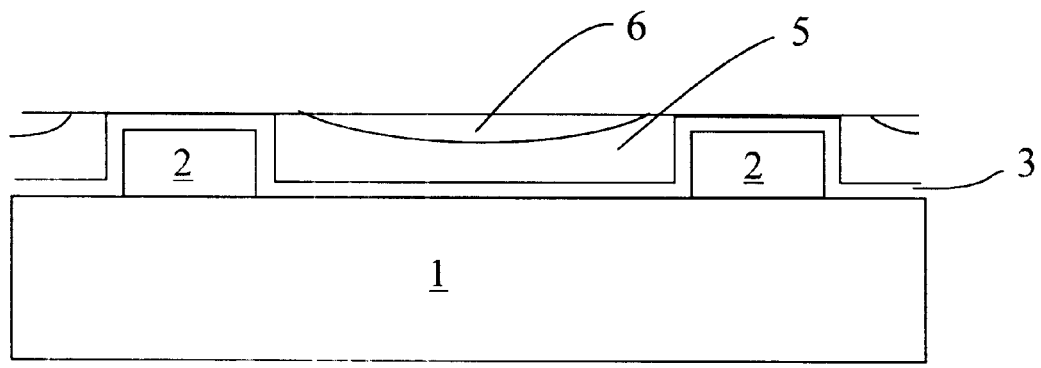
FIG. 2F shows the planarized wafer surface of the present invention after the completion of the chemical-mechanical polishing process.

FIG. 2C shows that essentially the entire polymer material based sacrificial layer is changed into a $SiO_2$-like layer 5 after an $N_2O$ plasma treatment, which was conducted at a pressure of several Torr, a temperature of about 400° C., and an RF power of about 100 to 300 Watt. FIG. 2D shows that a PETEOS film 6 was formed on top of the $SiO_2$-like sacrificial layer 5. The PETEOS film has an etch rate about half of $SiO_2$. FIG. 2E shows the beginning of the chemical-mechanical polishing process to remove the PETEOS film and the $SiO_2$-like sacrificial layer. Because materials at the high points of the topography were removed at a faster rate, the $SiO_2$-like layer at these high points would be first exposed to the chemical-mechanical polishing. And the relatively slow CMP removal rate PETEOS film served as an effective etch stop. FIG. 2F shows the planarized wafer surface of the present invention after the completion of the chemical-mechanical polishing process.

Figure 3:
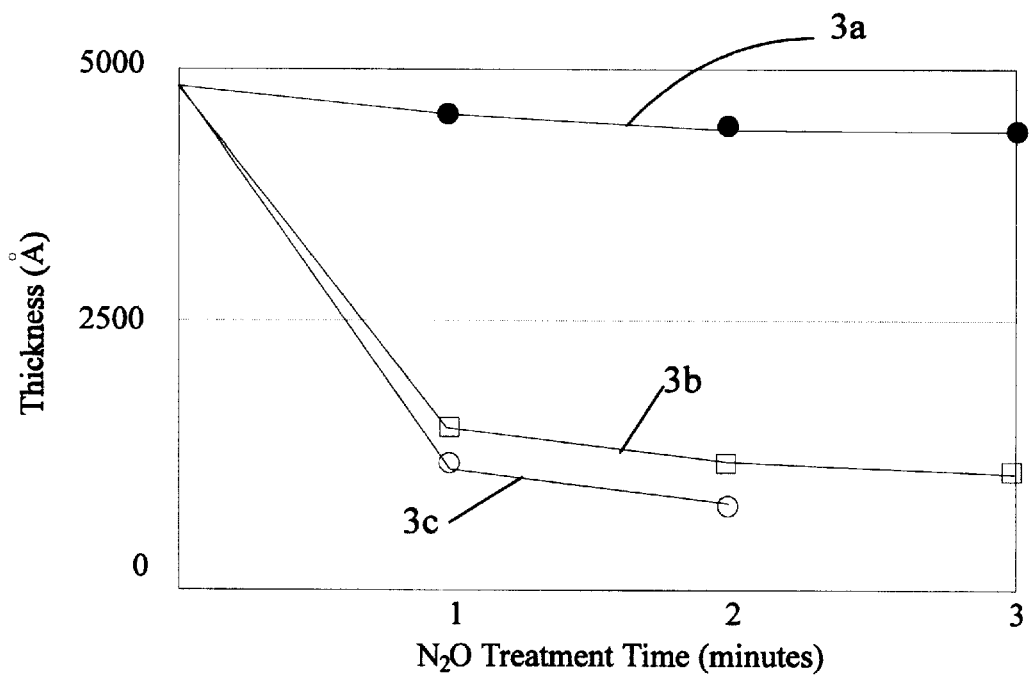
FIG. 3 shows plots of thickness of various polymeric material based sacrificial layers after being dipped in a hydrofluoric acid solution for different durations.

FIG. 3 shows plots of thicknesses vs extent of $N_2O$ treatment of three polymeric material based sacrificial layers after being dipped in a hydrofluoric acid solution for different durations. Curve 3a shows that the thickness of the polymer layer exhibited a slight decrease in thickness after an initial $N_2O$ treatment, but essentially no thickness change after subsequent treatments. Curves 3b and 3c show the thickness reductions as a function of $N_2O$ treatment time after they are dipped in a hydrofluoric acid solution for 30 seconds and 60 seconds, respectively. The concentration of hydrofluoric acid was 1 wt %. Curves 3b and 3c show that the polyimide layer is essentially inert to hydrofluoric acid without $N_2O$ treatment. However, the $N_2O$ treatment greatly enhanced the chemical reactivity of the polymer layer with respect to hydrofluoric acid solution.

Figure 4:
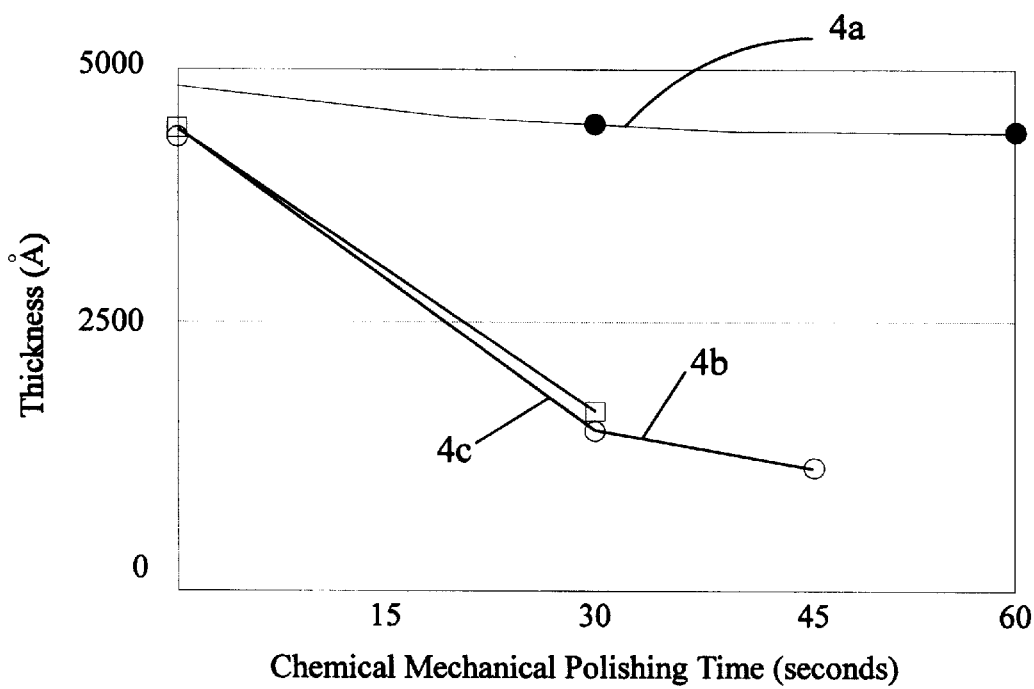
FIG. 4 shows plots of thickness of the various polymeric material based sacrificial layers after chemical-mechanical polishing.

FIG. 4 shows similar plots of thicknesses of three types of polymeric material based sacrificial layers after being subject to a chemical-mechanical polishing process. The first curve 4a, which was not subject to $N_2O$ treatment, showed little thickness change after being subject to the chemical-mechanical polishing process. The concentration of hydrofluoric acid was similarly at 1 wt %. Curves 4b and 4c are the plots of the thicknesses of the polyimide layers vs. chemical-mechanical polishing time for the polyimide layers that had been subject to $N_2O$ plasma treatment for 30 seconds and 60 second, respectively. Both curves 4b and 4c clearly demonstrate the effectiveness of $N_2O$ plasma treatment in enhancing the CMP removing rate of polymer-based sacrificial layers. The untreated polymer layer showed a CMP removal rate of about 200 Å/min. On comparison, the $N_2O$ treated polymer layer showed a CMP removal rate of about 4,000 Å/min, an increase of about 20 times.

As discussed earlier, the methods disclosed in the present invention and in the co-pending invention both allow oxide-type slurries to be used for the chemical-mechanical polishing of sacrificial layers made of non-oxide-type polymeric materials. The present invention remedies a weak area not covered by the method disclosed in the co-pending invention in that it further allows this novel method to be applied in areas wherein the trenches of the semiconductor device are too wide to permit the polymeric material to serve as an effective self-provided etch stop so as to minimize the dishing effect. As a result, the method disclosed in the present invention substantially improves the degree of planarization for the chemical-mechanically polished wafer surface, without incurring a substantially increased manufacturing cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for planarizing a surface of a semiconductor wafer using a chemical-mechanical polishing (CMP) process, said method comprising the steps of:

(a) applying a coating solution containing a polymeric material on a semiconductor wafer having a non-planar surface;

(b) curing said polymeric material to cause said polymeric material to become hardened and form a hardened polymeric layer;

(c) subjecting said hardened polymeric layer to a gas plasma treatment causing an outer portion of said polymeric layer to become a $SiO_2$-like polymer layer;

(d) depositing an oxide film on said $SiO_2$-like polymer layer wherein said oxide film having a CMP removal rate slower than said $SiO_2$-like polymer layer; and (e) polishing said low CMP removal rate oxide film and said $SiO_2$-like layer using a CMP process.

2. The method for planarizing a surface of a semiconductor wafer according to claim 1 wherein said gas plasma is selected from the group selecting from $N_2O$, $N_2$, $O_2$, and argon plasma.

3. The method for planarizing a surface of a semiconductor wafer according to claim 1 wherein said gas plasma is $N_2O$ plasma.

4. The method for planarizing a surface of a semiconductor wafer according to claim 1 wherein said gas plasma is generated at a pressure of several torr and a radio frequency power in the range of 100 to 300 Watt.

5. The method for planarizing a surface of a semiconductor wafer according to claim 1 wherein said polymeric material is selected from the group consisting of polyimide polyamide, and polyamideimide.

6. The method for planarizing a surface of a semiconductor wafer according to claim 1 wherein said polymeric material is polyimide.

7. The method for planarizing a surface of a semiconductor wafer according to claim 1 wherein said CMP slurry is also effective in polishing an silicon oxide layer.

8. The method for planarizing a surface of a semiconductor wafer according to claim 1 wherein said CMP slurry is a potassium hydroxide-stabilized slurry with fused silica.

9. The method for planarizing a surface of a semiconductor wafer according to claim 1 wherein said low CMP removal rate oxide film is a PETEOS (plasma enhanced tetraethyl orthosilicate) film.

* * * * *